US006198632B1

(12) United States Patent
Goff

(10) Patent No.: US 6,198,632 B1
(45) Date of Patent: Mar. 6, 2001

(54) SLIM MEDIA JACK

(75) Inventor: Darrell Goff, Layton, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/201,642

(22) Filed: Nov. 30, 1998

(51) Int. Cl.[7] ........................................ H05K 5/00

(52) U.S. Cl. .......................... 361/752; 361/736; 361/737; 361/761; 361/807; 439/946; 439/946.2; 439/638; 439/640

(58) Field of Search .................................... 361/736, 737, 361/760, 761, 807, 752; 439/676, 946, 946.2, 131, 621, 638, 640, 654

(56) References Cited

U.S. PATENT DOCUMENTS

| | | | | |
|---|---|---|---|---|
| 2,916,720 | | 12/1959 | Steans | 339/91 |
| 4,186,988 | | 2/1980 | Kobler | 339/176 MP |
| 4,241,974 | | 12/1980 | Hardesty | 339/154 A |
| 4,303,296 | | 12/1981 | Spaulding | 339/122 R |
| 4,352,492 | | 10/1982 | Smith | 273/1 |
| 4,407,559 | | 10/1983 | Meyer | 339/126 R |
| 4,428,636 | | 1/1984 | Kam et al. | 339/97 P |
| 4,710,136 | | 12/1987 | Suzuki | 439/374 |
| 4,778,410 | | 10/1988 | Tanaka | 439/676 |
| 4,915,648 | | 4/1990 | Takase et al. | 439/490 |
| 5,035,641 | | 7/1991 | Van-Santbrink et al. | 439/329 |
| 5,051,099 | | 9/1991 | Pickels et al. | 439/108 |
| 5,139,439 | | 8/1992 | Shie | 439/359 |
| 5,183,404 | | 2/1993 | Aldous et al. | 439/55 |
| 5,184,282 | | 2/1993 | Kaneda et al. | 361/395 |
| 5,336,099 | | 8/1994 | Aldous et al. | 439/131 |
| 5,338,210 | | 8/1994 | Beckham et al. | 439/131 |
| 5,391,094 | | 2/1995 | Kakinoki et al. | 439/638 |
| 5,411,405 | | 5/1995 | McDaniels et al. | 439/131 |
| 5,481,616 | | 1/1996 | Freadman | 381/90 |
| 5,499,923 | | 3/1996 | Archibald et al. | 439/26 |
| 5,505,633 | | 4/1996 | Broadbent | 439/329 |
| 5,509,811 | | 4/1996 | Homic | 439/55 |
| 5,538,442 | | 7/1996 | Okada | 439/676 |
| 5,547,401 | | 8/1996 | Aldous et al. | 439/676 |
| 5,561,727 | | 10/1996 | Akita et al. | 385/88 |
| 5,562,504 | * | 10/1996 | Moshayedi | 439/638 |
| 5,608,607 | | 3/1997 | Dittmer | 361/686 |
| 5,634,802 | | 6/1997 | Kerlaan | 439/131 |
| 5,660,568 | * | 8/1997 | Moshayedi | 439/654 |
| 5,667,395 | | 9/1997 | Okada et al. | 439/131 |
| 5,679,013 | | 10/1997 | Matsunaga et al. | 439/144 |
| 5,727,972 | | 3/1998 | Aldous et al. | 439/655 |
| 5,773,332 | | 6/1998 | Glad | 439/344 |
| 5,775,951 | * | 7/1998 | Gargiulo | 439/640 |
| 5,797,771 | | 8/1998 | Garside | 439/610 |
| 5,816,832 | | 10/1998 | Aldous et al. | 439/131 |
| 5,971,777 | * | 10/1999 | Garside | 439/131 |
| 5,971,813 | * | 10/1999 | Kunz et al. | 439/676 |
| 5,980,322 | * | 11/1999 | Madsen et al. | 439/621 |
| 5,989,042 | * | 11/1999 | Johnson et al. | 439/131 |
| 6,012,953 | * | 1/2000 | Francis | 439/676 |

FOREIGN PATENT DOCUMENTS

| | | |
|---|---|---|
| 62-256850 | 11/1986 | (JP) . |
| WO 95/13633 | 5/1995 | (WO) . |

OTHER PUBLICATIONS

P.E. Knight and D.R. Smith "Electrical Connector for Flat Flexible Cable," IBM Technical Disclosure Bulletin, vol. 25, No. 1, Jun. 1982.

* cited by examiner

*Primary Examiner*—Jayprakash N. Gandhi
*Assistant Examiner*—Tuan Dinh
(74) *Attorney, Agent, or Firm*—Workman, Nydegger & Seeley

(57) ABSTRACT

The present invention is designed to have half the thickness of physical/electrical media connectors such as the RJ-11 and the RJ-45 jacks. One embodiment of the present invention is an RJ-11 or an RJ-45 jack with a reduced thickness. The thickness of the present invention permits more than one media jack to be mounted in a Type I or a Type II PCMCIA card. The slim jack can be mounted either to the PCB or to the housing of the PCMCIA cards.

16 Claims, 2 Drawing Sheets

SLIM MEDIA JACK

BACKGROUND OF THE INVENTION

1. The Field of the Invention

The present invention relates to the field of computers. More particularly, it relates to an interface between a connector and a communications card in a computer system, and specifically to a physical/electrical media connector interface for use with a Type I or a Type II PCMCIA-architecture communications card, such as used in laptop and notebook computers.

2. The Prior State of the Art

Computer cards come in a variety of shapes and sizes. Today, Personal Computer Memory Card International Association (PCMCIA) is the standard which specifies both card hardware and system software requirements. PCMCIA cards can be used as memory devices, input/output devices such as modems and network cards, or as a large capacity drive. Each PCMCIA card is referred to as being Type I, Type II, or Type III. Type refers only to the physical thickness of the card. Type I cards have a physical thickness of 3.3 millimeters, Type II cards have a thickness of 5 millimeters, and Type III cards have a thickness of 10.5 millimeters. Some manufacturers have made even thicker Type IV cards, but Type IV has not been officially adopted by the PCMCIA standard.

Cards developed under the PCMCIA standard are thin for a reason. Devices using PCMCIA cards are getting smaller and space is an important consideration as devices such as laptops become more compact. The smaller or more efficient a product such as a communications card can be made, the more room there is for something else. One use of PCMCIA cards is as an ethernet card having(, an interface for a RJ-45 connection or as a modem having an interface for an RJ-11 connection. In other words, Type I and Type II PCMCIA cards are typically limited to one interface for physical/electrical connectors complying with FCC Rule 68.500, subpart F, such as an RJ type connector, due to printed circuit circuit board ("PCB"). area limitations. In fact, Type I PCMCIA cards typically do not have any media interfaces and are usually used as memory cards. Some Type III cards have more than one RJ type connector, which is possible because of the thickness of Type III PCMCIA cards. The thickness of Type III PCMCIA cards can lead to other problems or limitations.

For example, a notebook or laptop computer may have two PCMCIA slots, which means that the notebook or laptop can accommodate two Type I cards, or two Type II cards, or one Type III card. Current Type III cards may have more than one type of media interface, but the thickness of Type III cards eliminates the use of the additional PCMCIA slot. Type II cards usually have only one media interface, but permit both PCMCIA slots to be used. In other words, a Type III card having more media interfaces than a Type I or Type II card provides no real advantage to a user because the use of a PCMCIA slot is eliminated by the thickness of a Type III PCMCIA card.

PCMCIA cards are generally rectangular in shape, and part of the printed circuit board (PCB) inside the card must be cut away in order to accommodate the media interface, whether it be an RJ type connector, a 15 pin interface or some other physical/electrical media connector interface. The PCB that must be cut away represents a loss of PCB space that could otherwise be used for additional components.

The typical interface for an RJ type connector used in connection with communications cards and PCMCIA cards is illustrated in FIG. 1. Specifically, FIG. 1 is a perspective view of an interface 26 for an RJ-11 type connector 28 that is part of a retractable access portion 30. In order for the retractable access portion 30 to be used in PCMCIA architecture and be retractable, the shape of the PCB must be altered in order to accommodate retractable access portion 30 when it is retracted into a storage position. Retractable access portion 30 has a side 32 and an arm 34. Retractable access portion 30 is used in type IIPCMCIA cards because the arm 34 has a thickness of approximately 4.3 millimeters. As illustrated in FIG. 1, the thickness of retractable access portion 30 is substantially uniform. The thickness of arm 34 is the same as the thickness of side 32. Arm 34 is typically configured to be mounted on or attached to the housing of a PCMCIA card. It is desirable to increase not only the amount of PCB available for components, but also increase the number of media interfaces that a PCMCIA card can accommodate.

SUMMARY AND OBJECTS OF THE INVENTION

In general, the present invention enables a communications card to have more available space on the printed circuit board. In particular, by reducing the thickness of the media interface or retractable connector, the connector may be mounted on or attached to a portion of the printed circuit board, thereby allowing other interfaces or componentry to be placed on the other side of the printed circuit board (PCB).

The part of the PCB that must be cut and discarded in order to accommodate current media interfaces is partially recovered by the present invention and may be used for other purposes. Those purposes may include but are not limited to placing more components on the PCB or allowing current components to be arranged such that a second interface may be included on the other side of the communications card. Advantageously, the media interface or retractable connector can be connected to the housing of the communication card, which helps reduce stress on the PCB and prevent trace breakage. Alternatively, the media interface or retractable connector can be mounted directly on or connected to the PCB. Further, the present invention allows multiple Type I and/or Type II PCMCIA communication cards to be used in conjunction with multiple card slots in a computer or other electronic device, which allows multiple media interfaces to be used, because the reduced thickness interface or connector does not require the use of a Type III PCMCIA card for multiple media interfaces. In addition, because the reduced thickness interface or connector allows more than one connector to be attached to the PCB or communications card, that increases the versatility and potential uses of the communications card.

It is therefore an object of the present invention to allow more available space on a communications card for components.

It is yet another object of the present invention to permit more components to be placed on a PCB used in PCMCIA cards.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and arc not therefore to be considered limiting of its scope, the invention will be described and explained with additional specificity and detail through the use of the accompanying drawings in which.

DETAILED DESCRIPTION OF THE PREFERRED EMBODIMENTS

The present invention is directed towards a low profile media interface or retractable connector that provides additional space or a larger size PCB to be disposed within a housing of a communications card. The low profile media interface or retractable connector increases the efficiency of the communications card by allowing additional interfaces or connectors to be connected to the PCB or communications card, and/or increasing the amount of PCB space available for components. The present invention is especially useful in type I and Type II PCMCIA cards, but can also be used in Type III PCMCIA cards or in PC-card or other architectures.

Figure 2:
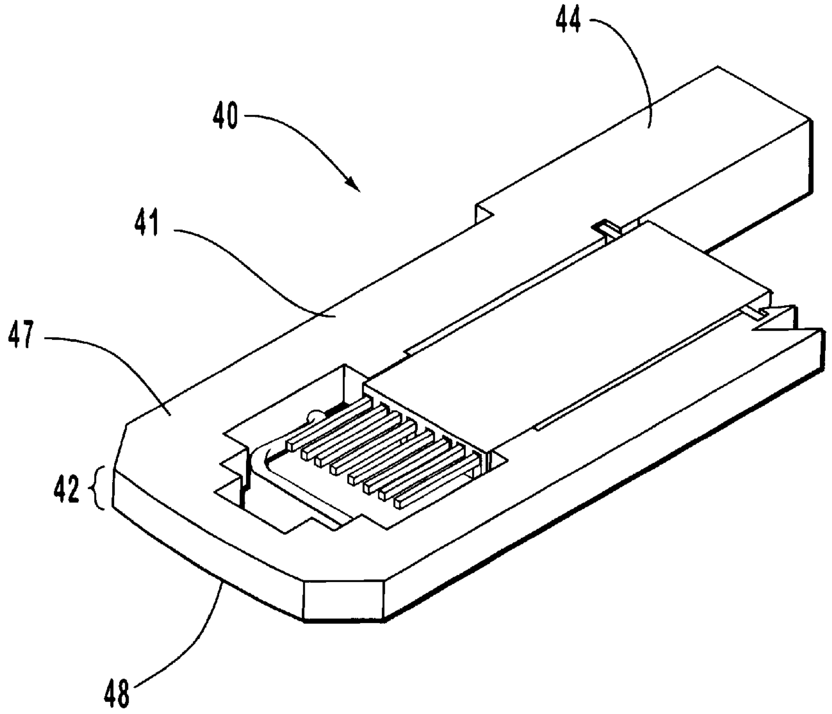
FIG. 2 is a perspective view of a preferred embodiment of the present invention, illustrating a retractable access portion.

FIG. 2 is a perspective view of a first retractable access portion or retractable connector 40. First retractable access portion 40 is an interface between a computer card and a media connector. The media connector may be a physical/electrical media connector complying with FCC Rule 68.500, subpart F, or a 15 pin connector, or any other type of media connector or interface capable of connecting to a computer card and the computer card may comply with the applicable PCMCIA standard FIG. 2, however, specifically illustrates a media interface used with RJ-11 media connectors. It can be appreciated that first retractable access portion 40 is capable of being designed to receive any type of media connector, including RJ type media connectors.

First retractable access portion 40 in FIG. 2 includes a body 41 with a side 42, and an arm 44 the body 41 of the retractable access portion 40 also includes a top surface 47 and a bottom surface 48. Note that side 42, as illustrated in FIG. 2, is substantially thinner than side 32 illustrated in FIG. 1. The thickness of side 42 is explained in conjunction with FIG. 4. The arm 44, as illustrated in FIG. 2, is preferably retractably connected to the PCMCIA card such that the retractable connector 40 can be selectively moved between a retracted position and an extended position. Arm 44 can be configured to connect to the PCB inside a PCMCIA card, or to the housing of the PCMCIA card. Arm 44 as illustrated in FIG. 2 has approximately twice the thickness of side 42 (e.g., in a Type II PCMCIA card, the arm 44 preferably has a thickness of about 4.3 mm), but arm 44 could have the same thickness as side 42 or any suitable thickness.

Figure 1:
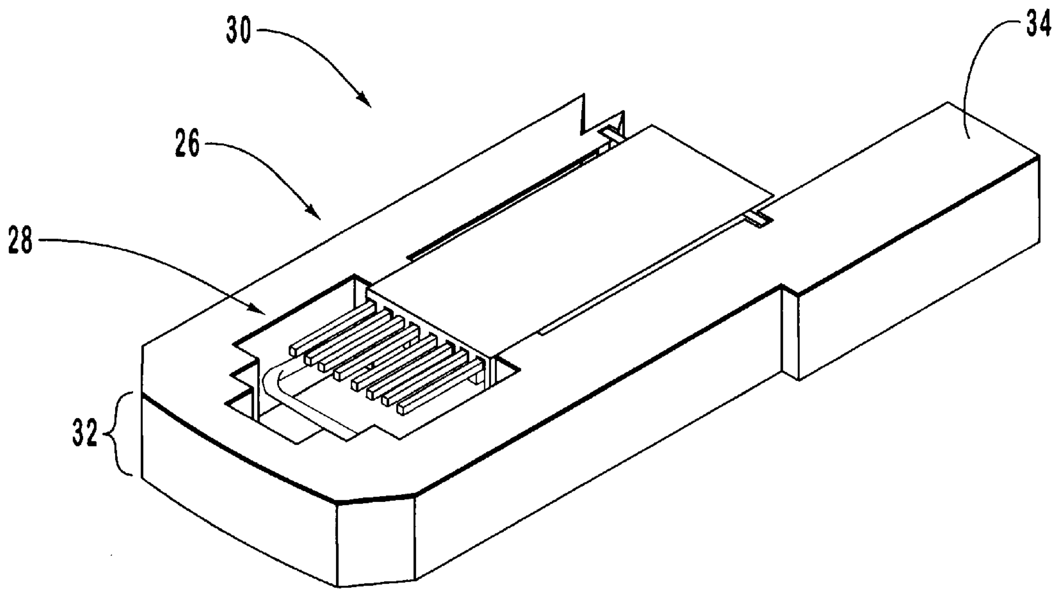
FIG. 1 (PRIOR ART)
FIG. 1 is a perspective view of a prior art RJ type media connector.
Figure 3:
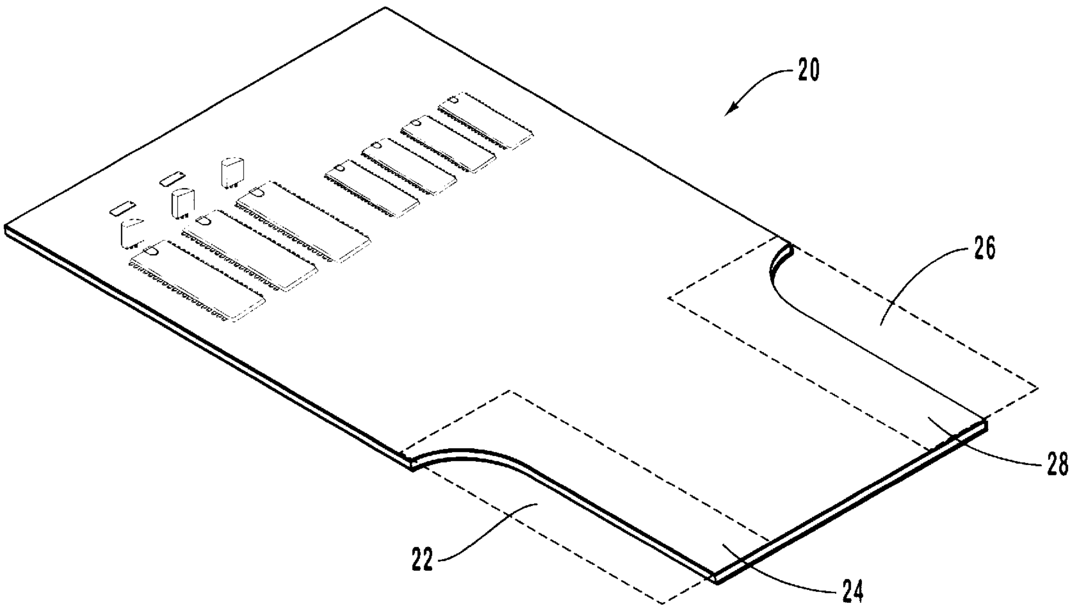
FIG. 3 is a perspective view of a PCB in accordance with another preferred embodiment of the present invention.

FIG. 3 is a perspective view of a PCB 20. PCB 20 is intended to be illustrative of the PCB card used in communications cards such as PCMCIA cards and is appropriately sized and shaped. FIG. 3 is discussed with references to FIG. 2. Currently, a first arm area 22 and a first component area 24 must be cut away and discarded in order to accommodate retractable access portion 30 as shown in FIG. 1. If an additional retractable access portion 30 as shown in FIG. 1 is to be added to the same PCB. a second arm area 26 and a second component area 28 must be removed. The removal of first arm area 22, first component area 24, second arm area 26 and second component area 28 reduces the amount of PCB space available for components needed for the PCMCIA card. Adding a plurality of retractable access portions to PCB 20 without having to discard PCB space is advantageous because not only is additional PCB space available for components, but the functionality of the PCMCIA card may be enhanced because the single PCMCIA card can now serve, for example, as a modem and an ethernet card rather than just a modem or just an ethernet card. In other words, first retractable access portion 40, in FIG. 2, makes a computer card such as a PCMCIA card multifunctional without having to change the dimensions of the PCMCIA card.

If, however, first retractable access portion 40, illustrated in FIG. 2, were to be placed on PCB 20 alone, then additional space would be recovered and could be used to enhance the functionality of the card. First retractable access portion 40, as illustrated, only requires the removal of first arm area 22. First component area 24 is recovered and may be used for any suitable purpose which includes the placement of additional components. If an additional first retractable access portion 40 is to be added to the same PCB 20, then the only additional space lost is second arm area 26. The embodiment of the present invention illustrated in FIG. 2 permits more than one media interface to be placed on a PCB card without sacrificing the space represented by first component area 24 and second component area 28. If the design of arm 44 were altered such that arm 44 had the thickness of side 42, then the PCB space represented by first arm area 22 and second arm area 26 would also be recovered and be available for any suitable purpose.

Figure 4:
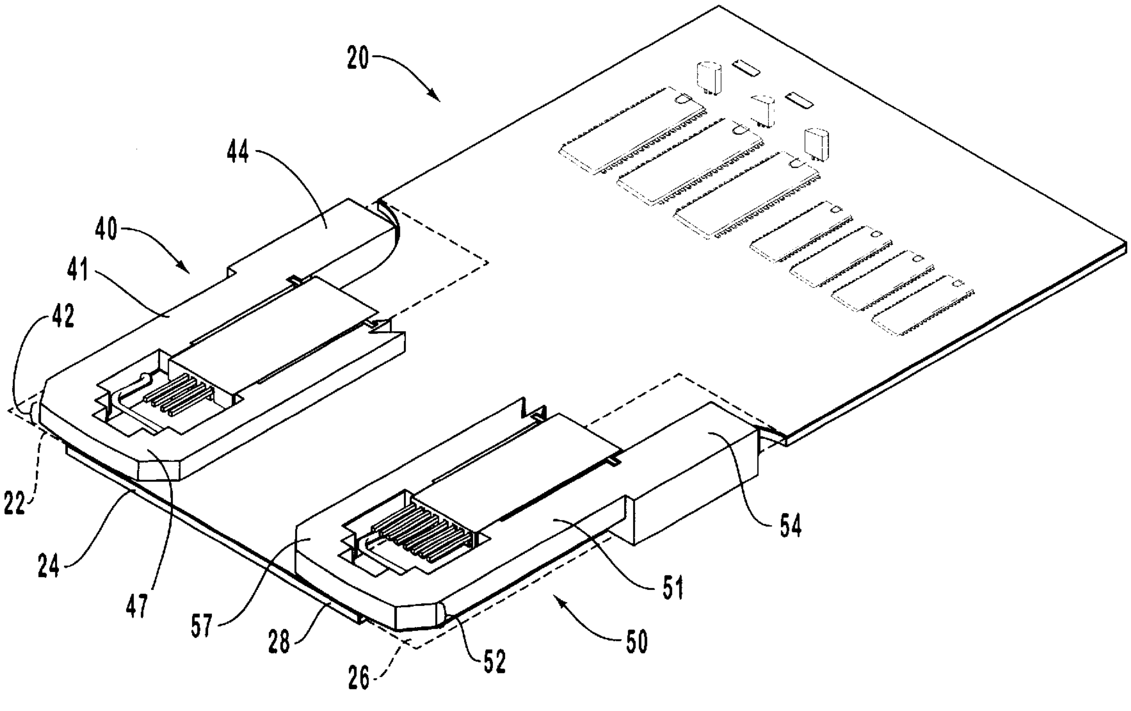
FIG. 4 is a perspective view of still another preferred embodiment of the present invention, illustrating a PCB including two retractable access portions.

FIG. 4 is a perspective view of PCB 20 having a first retractable access portion 40 and a second retractable access portion 50. FIG. 4 illustrates how first retractable access portion 40 and second retractable access portion 50 can be added to PCB 20 without sacrificing PCB space. This is accomplished by the design of first retractable access portion 40 and second retractable access portion 50. The difference between first retractable access portion 40 and second retractable access portion 50 is that each is configured to receive a different physical/electrical media connector. First retractable access portion 40 receives an RJ-11 media connector and second retractable access portion 50 receives an RJ-45 media connector. It is appreciated that first retractable access portion 40 and second retractable access portion 50 can be altered to receive any type of media connector. The following discussion only refers to first retractable access portion 40, but applies equally to second retractable access portion 50. Indeed, it is appreciated that it can apply to any embodiment of first retractable access portion 40.

Arm 44 has twice the thickness of side 42 and first arm area 22 of PCB 20 is removed in order to accommodate arm 44 as first retractable access portion 40 is retracted and extended from the PCMCIA card. However, first component area 24 is not discarded because first retractable access portion 40 is thinner than retractable access portion 30 illustrated in FIG. 1. The thinness of first retractable access portion 40 in FIG. 4 permits it to be positioned above PCB 20 such that at least a portion of the bottom surface 48 of the retractable connector is disposed over the first component area 24, while still satisfying the PCMCIA card standards. More specifically, the bottom surface 48 of the body 41 of the first retractable access portion 40 is positioned above first component area 24.

First component area 24 is available to be used for various components or other suitable purpose.

The additional components can be placed on either side of PCB 20. Thin components can be placed directly below first retractable access portion 40 on first component area 24 and larger or thicker components that would impede the retractability of first retractable access portion 40 are placed on the opposite side of PCB 20.

In another embodiment of the present invention, arm 44 and arm 54 may be altered such that each has a thickness corresponding to the thickness of side 42 and side 52. In this preferred embodiment, the arm 44, for example, can be attached to the housing of the PCMCIA card such that at least a portion of the bottom surface 48 of the body 41 of the retractable connector 40 is disposed over the first component area 24 and the first arm area 26. The method of attachment is well known in the prior art. In this embodiment, first arm area 22 and second arm area 26 are recovered and need not be discarded. First arm area 22 and second arm area 26 may be used for additional components, or for any other suitable purpose.

Another embodiment specifically contemplated by the present invention is a media interface capable of receiving more than one physical/electrical media connector. Using FIG. 4 as a reference, second retractable access portion 50 would be removed, but first retractable access portion 40 would be enlarged to accommodate more than one media connector. This embodiment would recover second arm area 26. More specifically, this embodiment allows more than one physical/electrical media interface to be placed on a Type II PCMCIA card without having to use a Type III PCMCIA card.

The present invention may be embodied in other specific forms without departing from its spirit or essential characteristics. The described embodiments arc to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An interface that allows a media connector to be connected to an electronic device, the interface comprising:

a printed circuit board including a first arm area with an upper surface and a lower surface, the printed circuit board including a first component area with an upper surface and a lower surface; and a first retractable connector movable relative to the printed circuit board, the first retractable connector including a body with an arm, a side, a top surface and a bottom surface, the first retractable connector being selectively movable between an extended position and a retracted position, at least a portion of the bottom surface of the first retractable connector being located directly next to the upper surface of the first component area when the retractable connector is in the retracted position.

2. The interface as in claim 1, wherein the lower surface of the first component area of the printed circuit board provides additional surface area for the placement of components on the printed circuit board.

3. The interface as in claim 1, wherein the bottom surface of the first retractable connector is located directly next to the upper surface of the first arm area when the first retractable connector is in the retracted position.

4. The interface as in claim 1, further comprising a second arm area and a second component area of the printed circuit board, the second arm area and the second component area including an upper surface and a lower surface; and further comprising a second retractable connector including a body with an arm, a side, a top surface and a bottom surface, the second retractable connector being selectively movable between an extended position and a retracted positions, at least a portion of the bottom surface of the second retractable connector being located directly next to the upper surface of the second component area when the retractable connector is in the retracted position.

5. The interface as in claim 1, wherein the lower surface of the second component area of the printed circuit board provides additional surface area for the placement of components on the printed circuit board.

6. The interface as in claim 1, wherein the bottom surface of the second retractable connector is located directly next to the upper surface of the second arm area when the second retractable connector is in the retracted position.

7. The interface as in claim 1, further comprising a thickness of the arm of the first retractable connector and a thickness of the side of the first retractable connector; wherein the thickness of the arm is approximately twice the thickness of the side.

8. The interface as in claim 1, further comprising a thickness of the arm of the first retractable connector, a thickness of the side of the first retractable connector, and a thickness of the printed circuit board; wherein the thickness of the arm is generally equal to or greater than the thickness of the side and the thickness of the printed circuit board.

9. An apparatus for allowing communication between a media connector and an electronic device the apparatus comprising:

a printed circuit board including a component area, an arm area and a thickness, the component area and the arm area including an upper surface and a lower surface; and a retractable connector attached to the printed circuit board, the retractable connector comprising:

a body including a top surface and a bottom surface, the body including a side with a thickness; and an arm attached to the body, the arm having a thickness;

wherein the retractable connector is selectively movable between an extended position and a retracted position;

wherein the bottom surface of the body is located directly next to the upper surface of the component area of the printed circuit board when the retractable connector is in the retracted position.

10. The apparatus as in claim 9, wherein the component area provides additional surface area for placement of additional components on said printed circuit board.

11. The apparatus as in claim 9, wherein the height of the side of the retractable connector and the height of the printed circuit board is generally equal to or less than the height of the arm.

12. The apparatus as in claim 9, wherein the height of the side of the retractable connector and the height of the printed circuit board is generally equal to or less than the 4.3 mm.

13. A retractable connector for allowing communication between a media connector and an electronic device, the retractable connector being adapted to communicate with a printed circuit board disposed within the electronic device, the printed circuit board including a thickness, a first component area, a first arm area and an upper surface, the retractable connector comprising:

a body including a top surface and a bottom surface, the body including a side with a thickness; and an arm attached to the body, the arm having a thickness;

wherein the retractable connector is selectively movable between an extended position and a retracted position relative to the printed circuit board;

wherein the bottom surface of the body is adapted to be located directly next to the upper surface of the first component area of the printed circuit board when the retractable connector is in the retracted position.

14. The retractable connector as in claim 13, wherein the first component area provides additional surface area for placement of additional components on said printed circuit board.

15. The retractable connector as in claim 13, wherein the height of the side of the retractable connector and the height of the printed circuit board is generally equal to or less than the height of the arm.

16. The retractable connector as in claim 13, wherein the height of the side of the retractable connector and the height of the printed circuit board is generally equal to or less than the 4.3 mm.

* * * * *

UNITED STATES PATENT AND TRADEMARK OFFICE
CERTIFICATE OF CORRECTION

PATENT NO. : 6,198,632 B1
DATED : March 6, 2001
INVENTOR(S) : Darrell Goff

It is certified that error appears in the above-identified patent and that said Letters Patent is hereby corrected as shown below:

Title page,
FOREIGN PATENT DOCUMENTS, line 1, please change "62-256850" to -- 61-256850 --

Column 1,
Line 33, please change "cards is as an" to -- card is as an --
Line 33, please change "having(, an" to -- having an --
Line 39, please change "("PCB"). area" to -- ("PCB") area --

Column 2,
Line 9, please change "in type IIPCMCIA cards" to -- in Type II PCMCIA cards --

Column 3,
Line 13, please change "and arc not therefore" to -- and are not therefore --
Line 41, please change "in type I" to -- in Type I --
Line 58, please change "side 42, and an arm 44 the body" to -- side 42 and an arm 44. The body --

Column 4,
Line 15, please change "PCB. a second" to -- PCB, a second --

Column 5,
Lines 14-15, please change "24.[Hrt][Tab]First component" to -- 24. First component --
Line 50, please change "embodiments arc to be" to -- embodiments are to be --

Column 6,
Line 21, please change "retracted positions" to -- retracted position --
Line 50, please delete "and"
Line 57, please insert -- and -- after "retracted position;"

UNITED STATES PATENT AND TRADEMARK OFFICE

CERTIFICATE OF CORRECTION

PATENT NO. : 6,198,632 B1
DATED : March 6, 2001
INVENTOR(S) : Darrell Goff

It is certified that error appears in the above-identified patent and that said Letters Patent is hereby corrected as shown below:

Column 7,
Line 12, please delete "and"
Line 16, please insert -- and -- after "circuit board;"

Signed and Sealed this

Twenty-sixth Day of March, 2002

Attest:

JAMES E. ROGAN
*Director of the United States Patent and Trademark Office*

*Attesting Officer*